(12) United States Patent
Yeh et al.

(10) Patent No.: US 12,368,450 B2
(45) Date of Patent: Jul. 22, 2025

(54) METHOD OF CALIBRATING OUTPUT OF ADC AND ADC USING THE SAME

(71) Applicant: United Microelectronics Corp., Hsinchu (TW)

(72) Inventors: Hsuan Chih Yeh, New Taipei (TW);
Yu-Yee Liow, Hsinchu County (TW);
Wen-Hong Hsu, Hsinchu (TW);
Po-Hua Chen, Changhua County (TW);
Chihwei Wu, Kaohsiung (TW); Pei Wen Sun, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 182 days.

(21) Appl. No.: 18/464,291

(22) Filed: Sep. 11, 2023

(65) Prior Publication Data
US 2025/0080129 A1    Mar. 6, 2025

(30) Foreign Application Priority Data

Aug. 31, 2023    (TW) .................................. 112133068

(51) Int. Cl.
*H03M 1/10*    (2006.01)
*H03M 1/46*    (2006.01)

(52) U.S. Cl.
CPC ......... *H03M 1/1023* (2013.01); *H03M 1/466* (2013.01)

(58) Field of Classification Search
CPC ............................. H03M 1/1023; H03M 1/466
USPC .......................... 341/120, 155, 161, 163, 172
See application file for complete search history.

(56) References Cited

U.S. PATENT DOCUMENTS

| 7,378,999 | B1 * | 5/2008 | McGrath | H03M 1/1028 |
| | | | | 341/120 |
| 7,501,965 | B2 | 3/2009 | Janakiraman | |
| 10,826,521 | B1 * | 11/2020 | Huang | H03M 1/466 |

* cited by examiner

*Primary Examiner* — Khai M Nguyen
(74) *Attorney, Agent, or Firm* — JCIPRNET

(57) ABSTRACT

According to an aspect of the disclosure, the disclosure provides an ADC which includes not limited to: a DAC configured to generate a positive input delta voltage and a negative input delta voltage, a comparator electrically connected to the DAC and configured to receive the positive input delta voltage to generate a first digital output value and to receive the negative input delta voltage to generate a second digital output value, a logic circuit configured to receive, from the comparator, the first digital output value and the second digital output value to generate a digital quantization code according to half of a sum of the first digital output value and the second digital output value, and a calibration circuit configured to receive the digital quantization code from the logic circuit and calibrate an output of the ADC according to the digital quantization code to eliminate an offset error value.

20 Claims, 9 Drawing Sheets

METHOD OF CALIBRATING OUTPUT OF ADC AND ADC USING THE SAME

CROSS REFERENCE TO RELATED APPLICATION

This application claims the priority benefit of Taiwan application serial no. 112133068, filed on Aug. 31, 2023. The entirety of the above-mentioned patent application is hereby incorporated by reference herein and made a part of this specification.

TECHNICAL FIELD

The disclosure is directed to a method of calibrating an output of an analog to digital converter (ADC) and an ADC using the same method.

BACKGROUND

In an ideal situation, an ADC converts from an analog input voltage to a digital output value which in the ideal situation perfectly represents the analog input voltage. For simplicity's sake, the ADC of FIG. 1 has only 2 bits but a real-world ADC has more than 2 bits. As shown in FIG. 1, the ADC 102 is assumed to receive an analog input voltage 101 which increases over time and spans over the full dynamic range of the ADC 102. The analog input voltage 101 is subsequently converted into a set of corresponding digital output values 103 which increase over time in a stepping manner. Assuming that ADC 102 is perfectly ideal, the digital output signal 103 is perfectly proportional to the analog input 101. In practice, the digital output signal 103 deviates from the expected value due to an offset error voltage inherent to the ADC, and such offset error should be corrected through a calibration mechanism in order for the ADC to function properly as expected.

A comparison between an ADC in a non-ideal situation and an ADC in an ideal situation is shown in FIG. 2. The curve 201 of FIG. 2 is ideal ADC having ideal steps. For example, if the analog input value 101 is less than 0.5 volt (V), the digital output signal 103 is 000, if the analog input value is between 0.5V and 1.5V, the digital output signal 103 is 001, and so forth. In reality however, instead of following the actual steps of the curve 201, an uncalibrated ADC may, for example, follow the actual steps 202 which contains an offset error. If the curve 201 of the ADC follows the ideal steps 201, the steps would start from the ideal offset point 203. However, due to an offset error voltage 205, the actual steps 202 of the ADC would start from the actual offset point 204. Consequently, the ADC does not output the digital output signal 103 as expected.

FIG. 3 shows the effect of the offset error voltage (e.g. 205) on the comparator (e.g. 503 FIG. 5) of an ADC. In an ideal ADC 301 having an ideal transfer curve (e.g. 201), if the input voltage $V_{in}$ 303 is greater than the reference voltage $V_{ref}$ 304, then the digital output $D_i$ of the ADC is a binary value of 1. Otherwise, the binary value of the digital output $D_i$ of the ideal ADC 301 is 0. However, in reality, the ADC 301 having an offset error voltage (e.g. 205) would behave differently. For the ADC 302 having the transfer curve with the actual steps (e.g. 202), if the input voltage $V_{in}$ 305 subtracted by the offset error voltage (e.g. 205) is greater than the reference voltage $V_{ref}$ 306, then the digital output $D_i$ of the ADC 302 is a binary value of 1. Otherwise, the binary value of the digital output $D_i$ of the ADC 302 is 0.

As seen in the examples of FIG. 2 and FIG. 3, an ADC in actual practice typically has the offset error voltage (e.g. 205) which would cause the ADC to output a digital output value that deviates from an expected, ideal value. Therefore, a mechanism to calibrate the output of an ADC by eliminating or minimizing the offset error voltage would enhance the performance of a non-ideal ADC.

SUMMARY OF THE DISCLOSURE

Accordingly, in order to resolve the above-described challenge, the disclosure is directed to a method of calibrating an output of an analog to digital converter (ADC) and an ADC using the same method.

In an aspect, the disclosure is directed to a method of calibrating an output of an ADC. The method includes not limited to generating, by a digital to analog (DAC) converter, a positive input delta voltage; receiving, by a comparator, the positive input delta voltage to generate a first digital output value; generating, by the DAC, a negative input delta voltage having a same magnitude as the positive input delta voltage; receiving, by the comparator, the negative input delta voltage to generate a second digital output value; determining, by a logic circuit, a digital quantization code according to half of a sum of the first digital output value and the second digital output value; and calibrating, by a calibration circuit, the output of the ADC by using the digital quantization code to eliminate an offset error value.

In another aspect, the disclosure is directed to an ADC which includes not limited to: a digital to analog converter (DAC) configured to generate a positive input delta voltage and a negative input delta voltage, a comparator electrically connected to the DAC and configured to receive the positive input delta voltage to generate a first digital output value and to receive the negative input delta voltage to generate a second digital output value, a logic circuit configured to receive, from the comparator, the first digital output value and the second digital output value to generate a digital quantization code according to half of a sum of the first digital output value and the second digital output value, and a calibration circuit configured to receive the digital quantization code from the logic circuit and calibrate an output of the ADC according to the digital quantization code to eliminate an offset error value.

In order to make the aforementioned-features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

It should be understood, however, that this summary may not contain all of the aspect and embodiments of the disclosure and is therefore not meant to be limiting or restrictive in any manner. Also, the disclosure would include improvements and modifications which are obvious to one skilled in the art.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
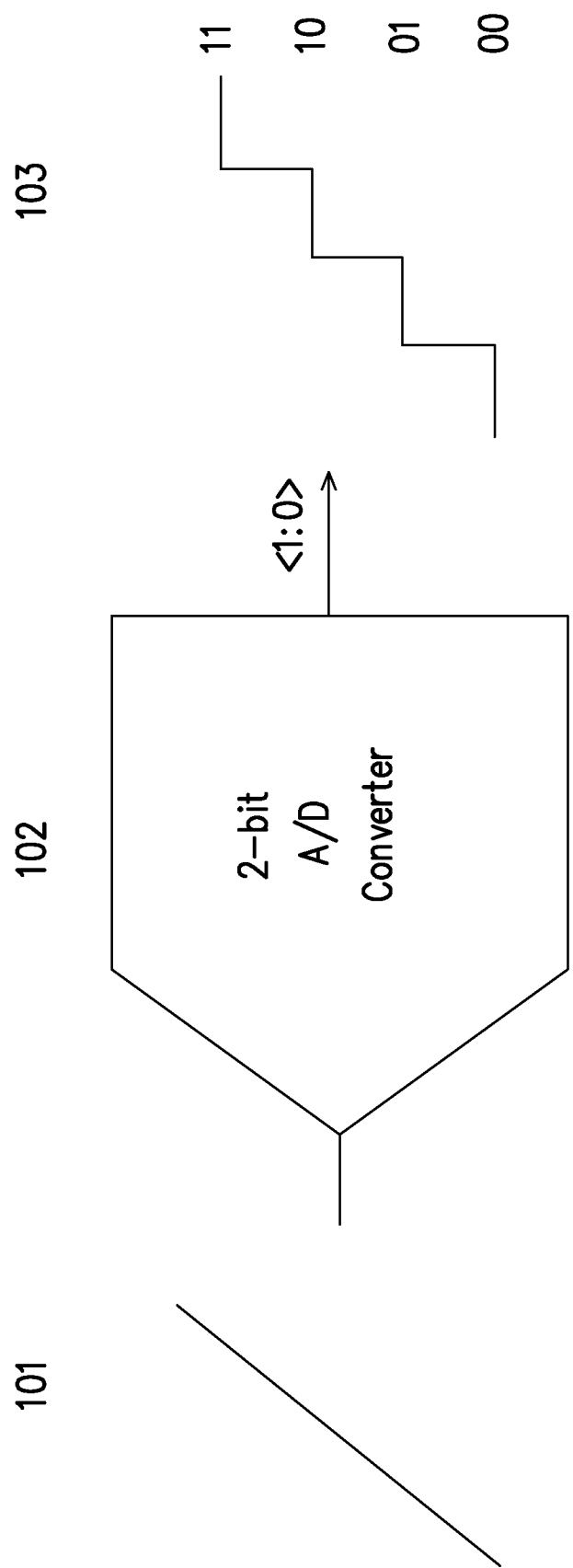
FIG. 1 illustrates an operation of an ADC.
Figure 2:
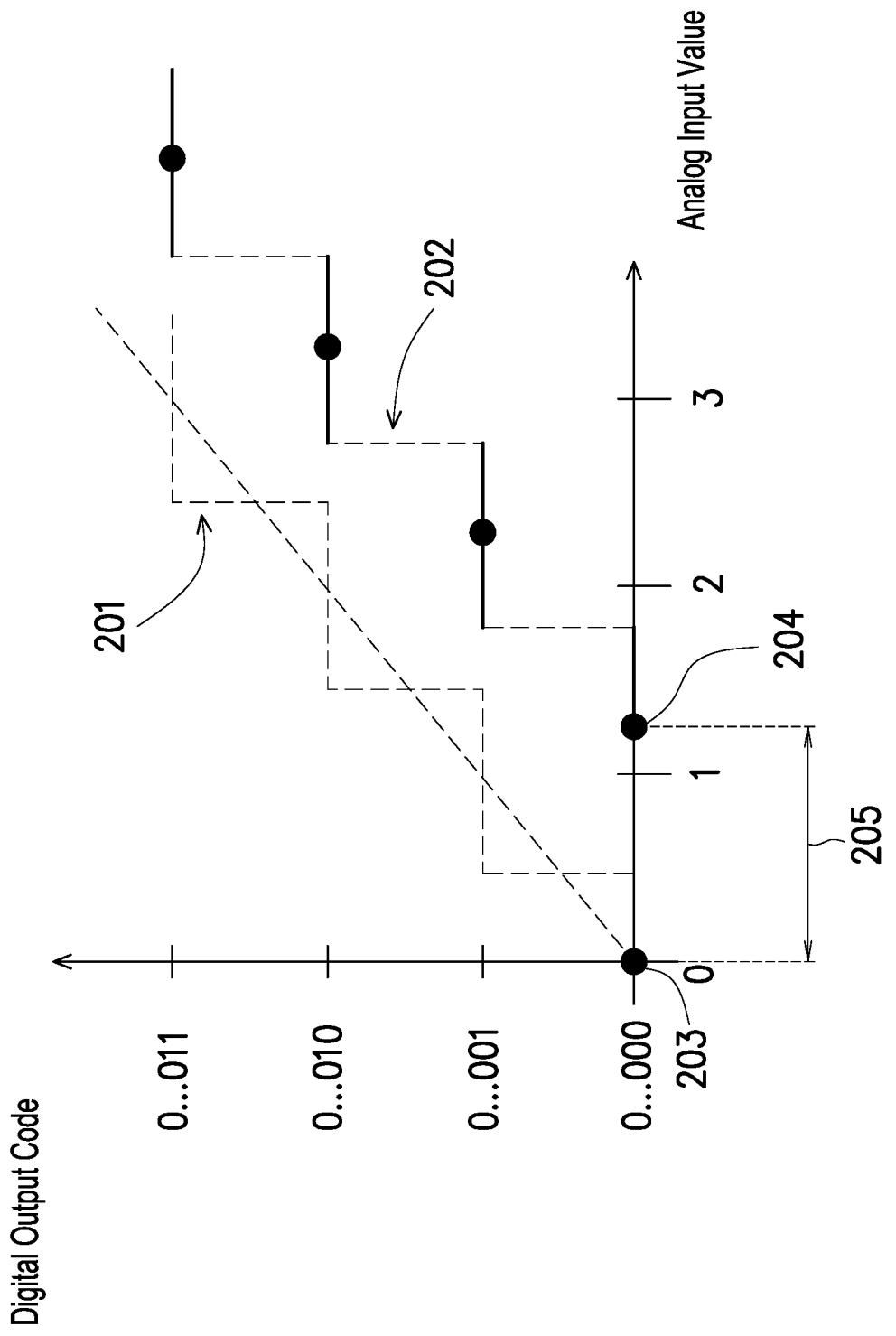
FIG. 2 illustrates a typical ADC transfer curve of an ADC having an offset error.
Figure 3:
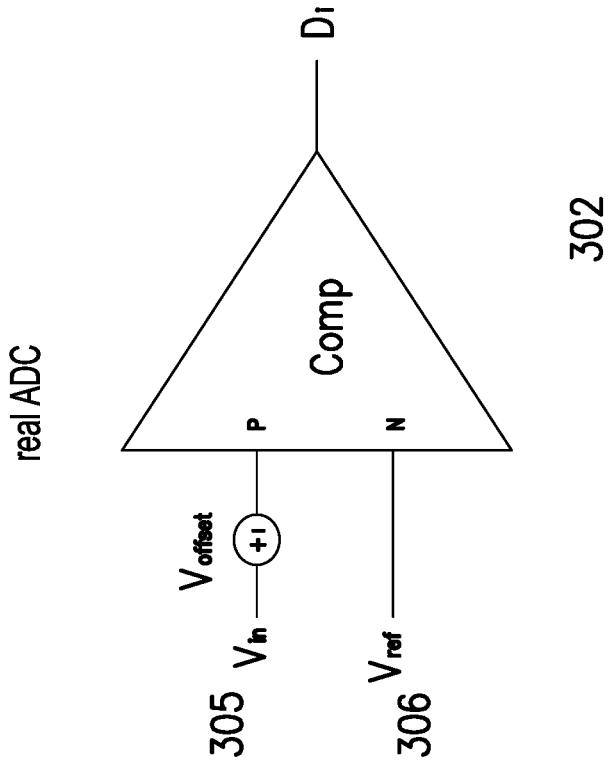
FIG. 3 illustrates an effect of an offset error value for a comparator within the ADC.
Figure 3:
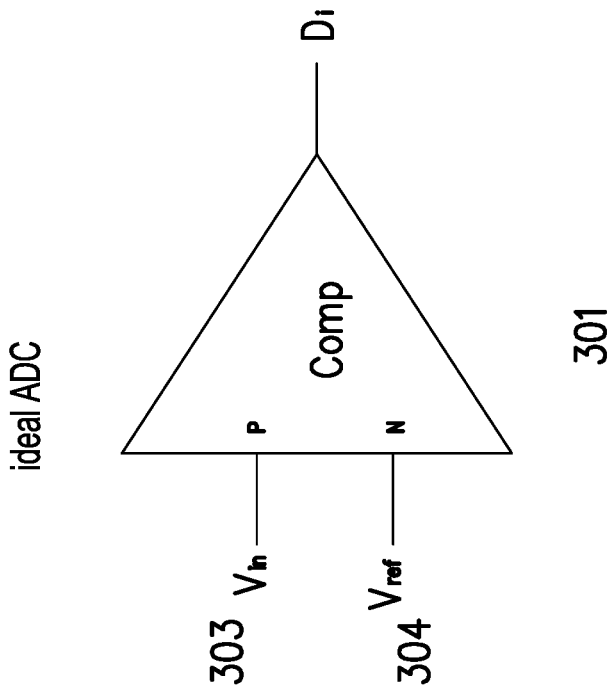

Reference will now be made in detail to the present exemplary embodiments of the disclosure, examples of which are illustrated in the accompanying drawings. Wherever possible, the same reference numbers are used in the drawings and the description to refer to the same or like parts.

Figure 4:
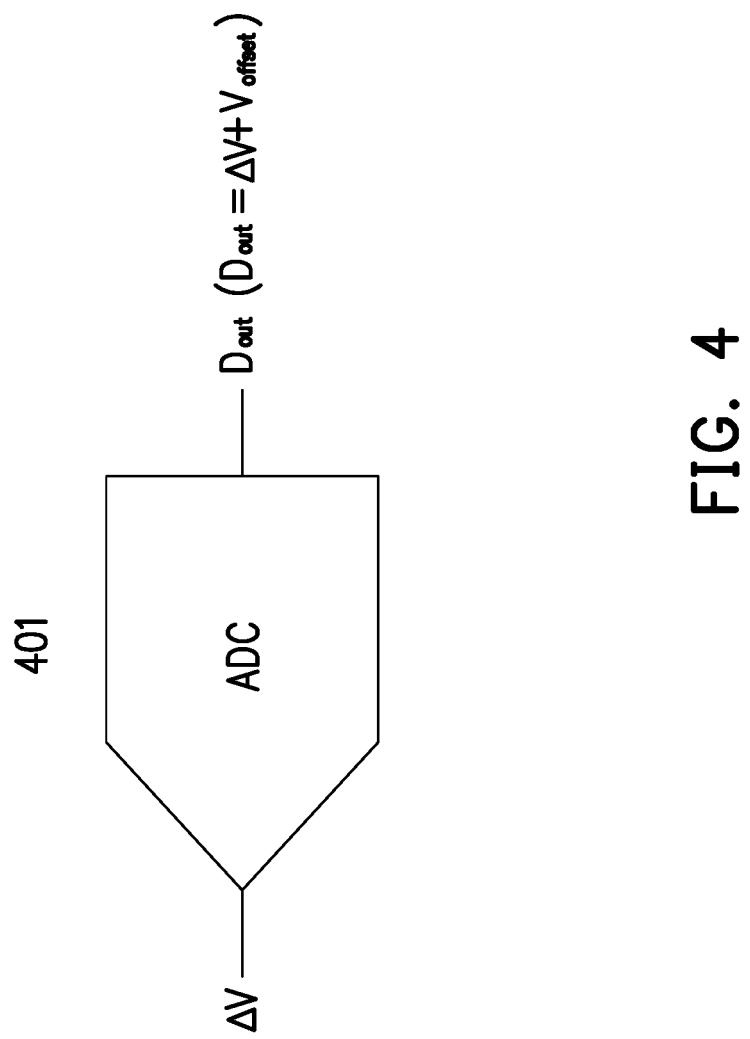
FIG. 4 illustrates an output code of the ADC having an offset error value.

As previously described, the performance of a real ADC could be improved through a calibration mechanism. One concept of the disclosure for realizing the calibration mechanism is shown in FIG. 4. By applying an differential analog input voltage (delta input voltage or $\Delta V$) into a real ADC 401, the output voltage, $D_{out}$, is the expected digital equivalent of $\Delta V$ plus an offset error voltage, $V_{offset}$. By eliminating $V_{offset}$, the performance of a real ADC 401 could be improved.

Figure 5:
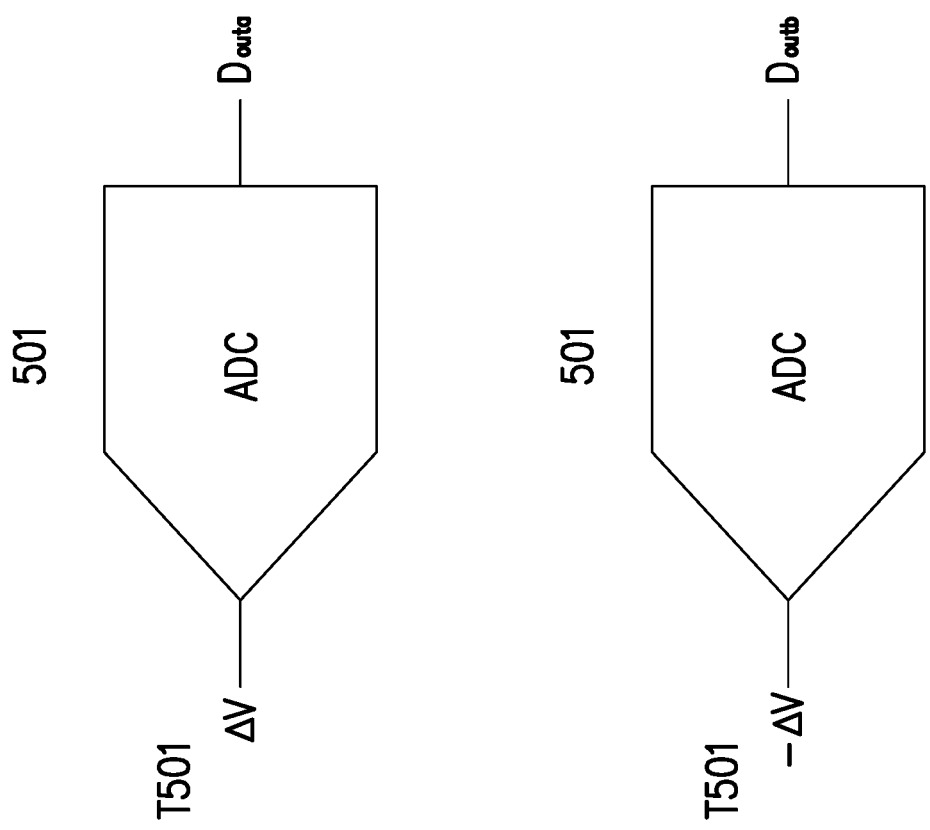
FIG. 5 a hardware block diagram of an ADC according to an exemplary embodiment of the disclosure.

An inventive concept of the disclosure is shown in FIG. 5, which provides a mechanism to calibrate an output ($D_{outA}$ or $D_{outB}$) of an ADC 501. At a first time period T501, a positive (+) $\Delta V$ is provided to the ADC 501 which converts the $+\Delta V$ into a digital value, $D_{outA}$. The digital value, $D_{OutA}$ includes a digital representation of the positive $\Delta V$, $D_{outA}$, plus an offset error value ($V_{offset}$). At a second time period T502, which could be before or after the first time period T501, a negative (−) $\Delta V$ is provided to the (same) ADC 501 which converts the $-\Delta V$ into a digital value, $D_{outB}$. The digital value, $D_{outB}$ includes a digital representation of $-\Delta V$, $D_{outB}$, plus an offset error value ($V_{offset}$). After adding $D_{outA}$ with $D_{outB}$, the sum of which is twice the amount of $V_{offset}$ while the $+\Delta V$ and the $-\Delta V$ cancel each other out. Thus, the $V_{offset}$ could be known by adding $D_{outA}$ with $D_{out}$s to generate the sum, and the sum ($D_{outA}+D_{outB}$) is then divided by 2 to derive $V_{offset}$, which is in digital form and is the $V_{offset}$ quantization code.

Figure 6:
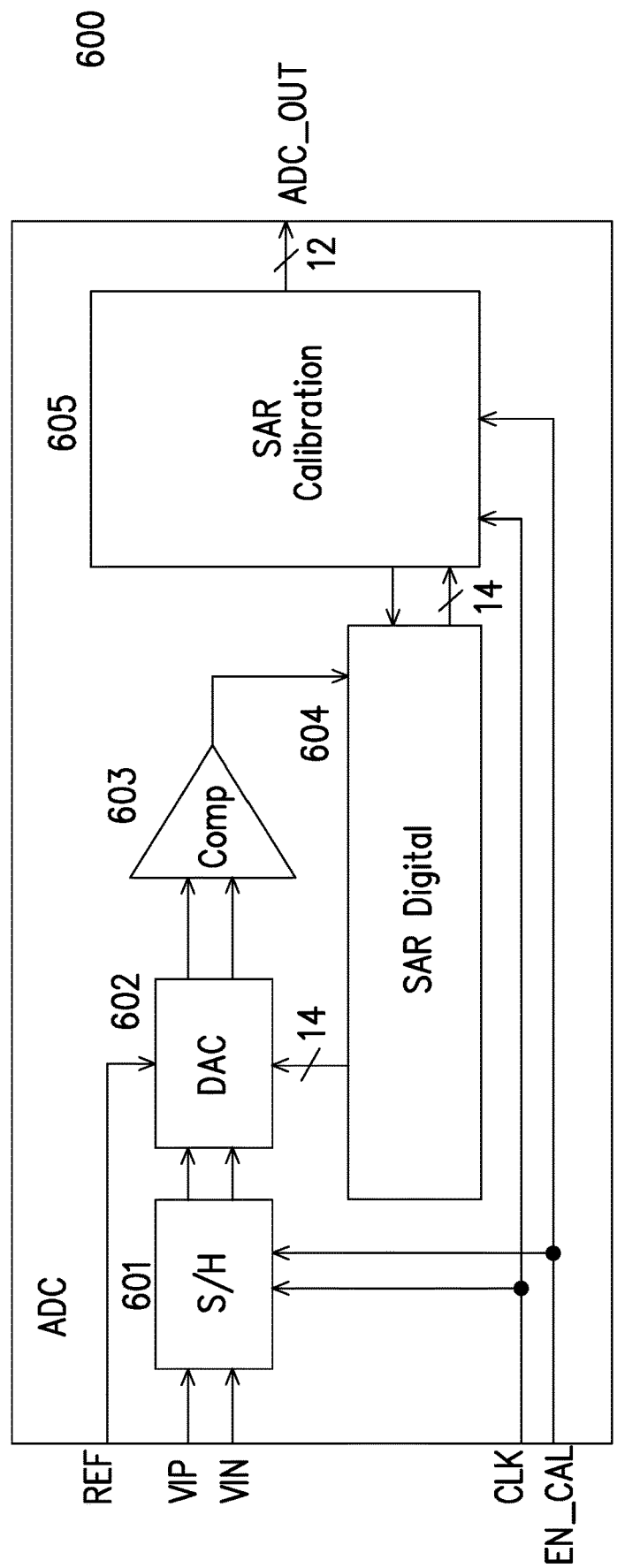
FIG. 6 is a flow chart which illustrates the method of calibrating an output of the ADC according to an exemplary embodiment of the disclosure.
Figure 7:
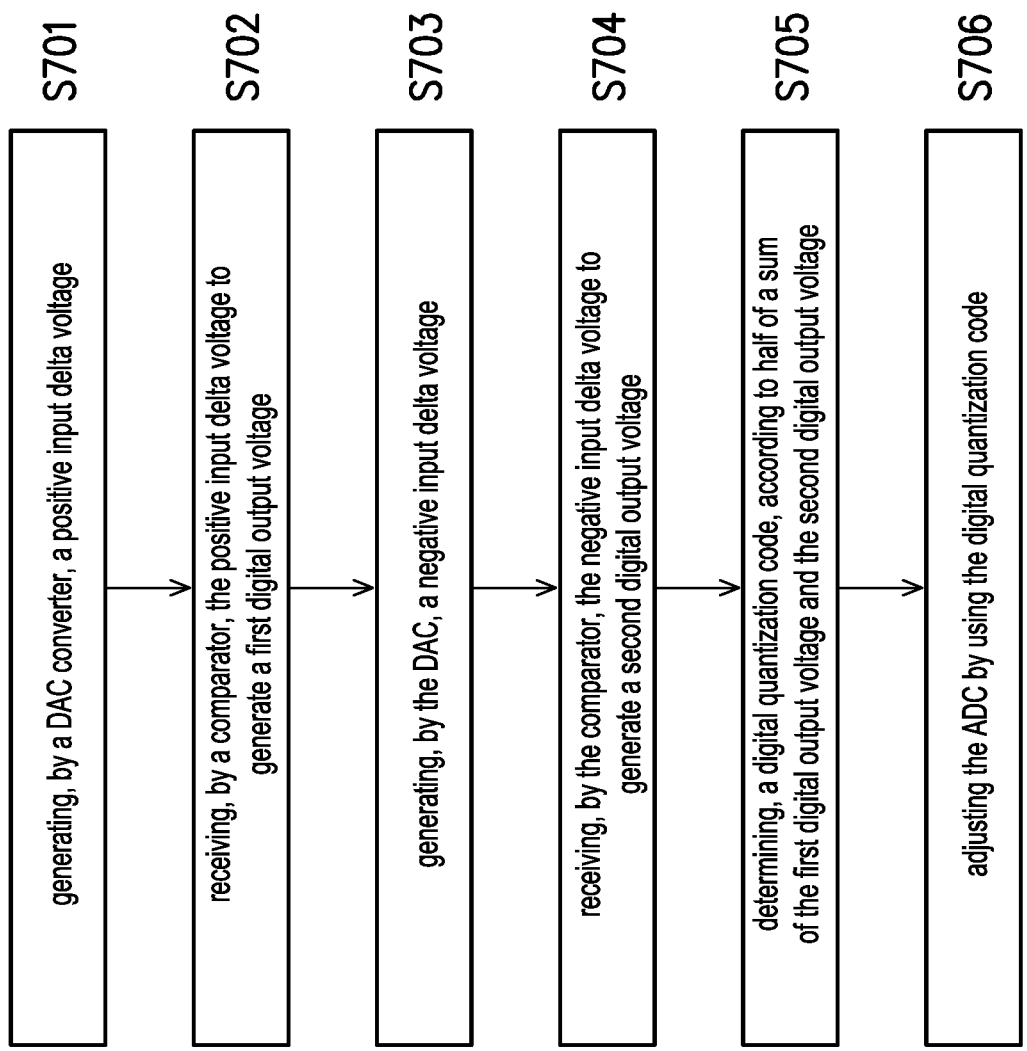
FIG. 7 illustrates a mechanism for obtaining the quantization code for the offset error value according to an exemplary embodiment of the disclosure.

To realize the inventive concept as described above and as shown in FIG. 5. The disclosure provides an ADC having the mechanism to calibrate the output of the ADC as shown in FIG. 6 and a method of calibrating the output of the ADC as shown in FIG. 7. As shown in FIG. 6, the disclosure provides an ADC 600 having a calibration mechanism which eliminates or minimizes the offset error voltage by calibrating the output of the ADC. The ADC 500 includes not limited to a sample and hold (S/H) circuit 601, a digital to analog converter (DAC) 602, a comparator 603, a successive approximation register (SAR) digital logic circuit 604, and a SAR calibration circuit 605. Since the principle of operation of the ADC under normal operation is current known, an explanation would not be necessary. But the principle of operation for calibrating the output (ADC_OUT) of the ADC 600 is described as follows.

At a first time period (e.g. T501), the DAC 602 would generate a positive input delta voltage (e.g +$\Delta V$) which is received by the comparator 603 to generate a first digital output value (e.g. $D_{outA}$). At a second time period (e.g. T502), the DAC 602 would generate a negative (e.g. −$\Delta V$) which is received by the comparator 603 to generate a second digital output value (e.g. $D_{outB}$). It should be noted that the functions performed during the first time period and the second time period are interchangeable. The −$\Delta V$ may ideally have the same magnitude as the +$\Delta V$. For example, if +$\Delta V$ is 1.8 V, then −$\Delta V$ is −1.8V. Based on first digital output value and the second digital output value, the SAR logic circuit 604 may determine the $V_{offset}$ quantization code by calculating a sum which is derived from adding the first digital output value to the second digital output value. The sum is then divided by 2 so as to obtain the $V_{offset}$ quantization code. In other words, the $V_{offset}$ quantization code is half of the sum of the first digital output value and the second digital output value. After obtaining the quantization code, the SAR calibration circuit 605 may calibrate the output (ADC_OUT) of the ADC 600 by using the digital $V_{offset}$ quantization code to eliminate or minimize the offset error value ($V_{offset}$), such as by subtracting the $V_{offset}$ quantization code from a raw output of the ADC obtained before calibration.

Referring to the method of calibrating the output of the ADC as shown in FIG. 7, in step S701, the ADC (e.g. 600) would generate, by using DAC (e.g. 602), a positive input delta voltage (e.g. +$\Delta V$). In step S702, the comparator (e.g. 703) would receive the positive input delta voltage so to generate a first digital output value (e.g. $D_{outA}$). In step S703, the ADC would generate, by using the DAC, a negative input delta voltage (e.g. −$\Delta V$) having a same magnitude as the positive input delta voltage. In step S704, the comparator would receive the negative input delta voltage to generate a second digital output value (e.g. $D_{outB}$). In step S705, the SAR logic circuit (e.g. 604) would calculate the digital quantization code according to half of a sum of the first digital output value and the second digital output value. In step S706, the calibration circuit (e.g. 605) would perform the calibration of the output of the ADC by using the digital quantization code to eliminate the offset error value (e.g. $V_{offset}$).

Figure 8:
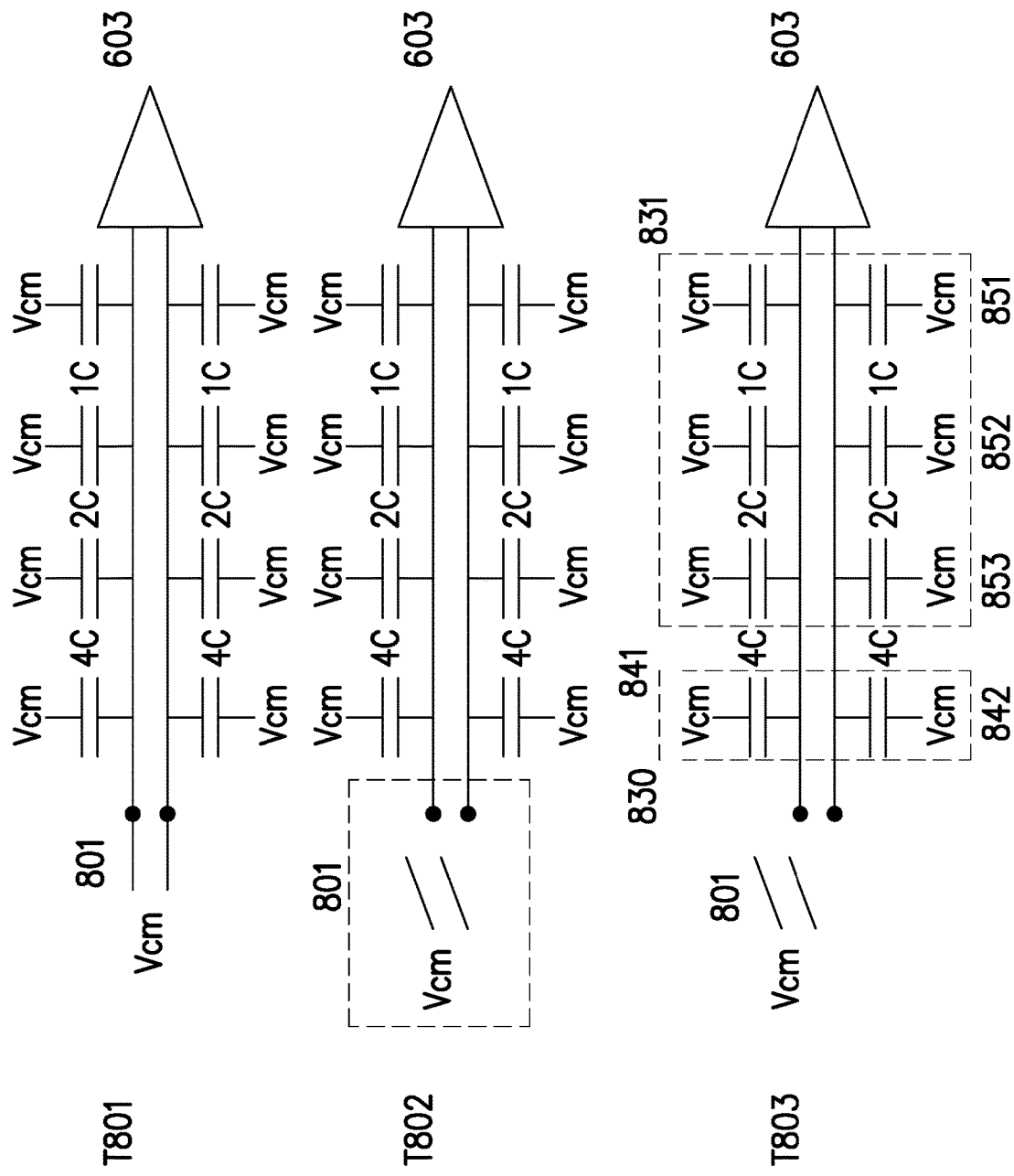
FIG. 8 illustrates an operating principle of a circuit for generating the positive input delta voltage according to an exemplary embodiment of the disclosure.
Figure 9:
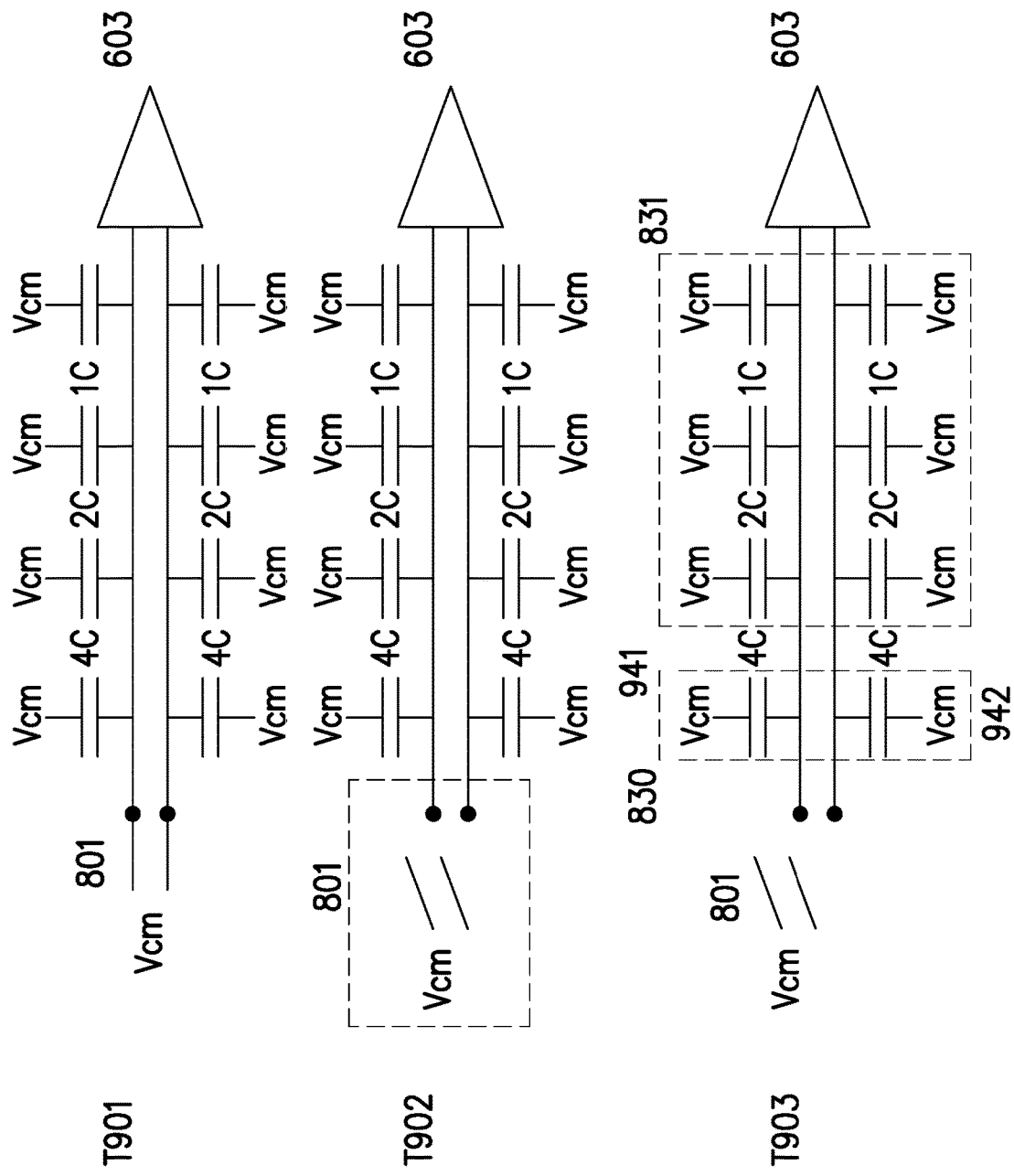
FIG. 9 illustrates an operating principle of the circuit for generating the negative input delta voltage according to an exemplary embodiment of the disclosure.

To further expand upon the inventive concepts, FIG. 8 and FIG. 9 describe an operation of the circuits of the DAC (e.g. 602) and the comparator (e.g. 603) with further details. First, the structure of the capacitor array of the DAC is to be described. Referring to FIG. 8, the DAC includes a capacitor array which includes a first block 830 which is connected to the input switch 801 and a second block 831 which is connected to the comparator 603, where the first block 830 may include a first capacitor 841 and a second capacitor 842. The first capacitor 841 has one terminal which is to be set to a first voltage (e.g. Vrep) and another terminal which is connected to the input switch 801 and the first terminal of the comparator 603. The second capacitor 842 includes one terminal which is to be set to a second voltage (e.g. Vren) and another terminal which is connected to the input switch 801 and the second terminal of the comparator 603.

Each column of the second block 831 includes a pair of capacitors where one capacitor is connected to a first terminal of the comparator 603 and another capacitor is connected to a second terminal of the comparator 603. Each column of the second block is connected to other columns and the first block 830 in parallel. The capacitors of the second block 831 closer to the input switch 801 have larger capacitive values than capacitors of the second block 831 closer to the comparator 603. For example, each of a first column of capacitors 851 has a value of 1C, each of the second column of capacitors 852 has a value of 2C, and each of the third column of capacitors 853 has a value of 4C. Each of the first capacitor 841 and the second capacitor 842 of the first block 830 may also have a value of 4C. For all of the capacitors of the second block 831, one of the terminals is connected to either a first input or a second input of the comparator 831 as shown in FIG. 8, and the other terminal is connected to a bias voltage of common voltage (Vcm). The bias voltages of the second block 831 do not change during the operation of FIG. 8 and FIG. 9 which are described as follows.

At a time period T801, input switch 801 of the the DAC (e.g. 602) is connected to the capacitor array in a closed state. At a time period T802, the SAR logic circuit 804 controls the input switch 801 from the closed state to a floating state relative to the capacitor array so as to be disconnected from the first block 830. At a time period T803, while the switch is at the floating state, the SAR logic circuit 804 would set one of the terminals of the first capacitor 841 to a first voltage (Vrep) and one of the terminals of the second capacitor 842 to a second voltage (Vren) in a manner shown in FIG. 8. The ΔV is the difference between the first voltage and the second voltage. For example, if the first voltage is +1.8V and the second voltage is 0V, then ΔV is a positive 1.8V. After the +ΔV has been generated, the first digital output value (e.g. $D_{outA}$) could be determined by the SAR logic circuit 604. The first digital output value at this point would include the magnitude of +ΔV and the offset error value.

Referring to FIG. 9, a time period T901, input switch 801 of the the DAC (e.g. 602) is connected to the capacitor array in a closed state. At a time period T902, the SAR logic circuit 804 controls the input switch 801 from the closed state to a floating state relative to the capacitor array so as to be disconnected from the first block 830. At a time period T903, while the switch is at the floating state, the SAR logic circuit 804 would set one of the terminals of the first capacitor 841 to the second voltage (Vren) and one of the terminals of the second capacitor 842 to the first voltage (Vrep). The ΔV is then the difference between the second voltage and the first voltage. For example, if the second voltage set for the first capacitor 841 is 0V and the first voltage set for the second capacitor is 1.8V, then ΔV is a negative 1.8V. After the −ΔV has been generated, the second digital output value (e.g. $D_{outB}$) could be determined by the SAR logic circuit 604. The second digital output value includes the magnitude of −ΔV and the offset error value. It should be noted that the functions performed during T801~T803 are interchangeable with functions performed during T901~T903.

Once the first digital output value and the second digital output value are determined, the SAR logic circuit 604 would calculate the $V_{offset}$ quantization code based on the sum of the first digital output value and the second digital output value divide by 2. The $V_{offset}$ quantization code is then received by the SAR calibration circuit 605 which is able to utilize the $V_{offset}$ quantization code to calibrate the output value (ADC_OUT) of the ADC such as by subtracting the raw converted value with the $V_{offset}$ quantization code whenever an ADC operation is performed.

In view of the aforementioned-descriptions, the present disclosure is suitable for being used an ADC and is able to minimize or eliminate the error offset voltage inherent within the ADC in order for the ADC to converter from an analog signal to a digital signal which equals to or is very similar to the expected value.

No element, act, or instruction used in the detailed description of disclosed embodiments of the present application should be construed as absolutely critical or essential to the present disclosure unless explicitly described as such. Also, as used herein, each of the indefinite articles "a" and "an" could include more than one item. If only one item is intended, the terms "a single" or similar languages would be used. Furthermore, the terms "any of" followed by a listing of a plurality of items and/or a plurality of categories of items, as used herein, are intended to include "any of", "any combination of", "any multiple of", and/or "any combination of multiples of the items and/or the categories of items, individually or in conjunction with other items and/or other categories of items. Further, as used herein, the term "set" is intended to include any number of items, including zero. Further, as used herein, the term "number" is intended to include any number, including zero.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of calibrating an output of an analog to digital converter (ADC), the method comprising:
generating, by a digital to analog (DAC) converter, a positive input delta voltage;
receiving, by a comparator, the positive input delta voltage to generate a first digital output value;
generating, by the DAC, a negative input delta voltage having a same magnitude as the positive input delta voltage;
receiving, by the comparator, the negative input delta voltage to generate a second digital output value;
determining, by a logic circuit, a digital quantization code according to half of a sum of the first digital output value and the second digital output value; and
calibrating, by a calibration circuit, the output of the ADC by using the digital quantization code to eliminate an offset error value.

2. The method of claim 1, wherein generating, by the DAC converter, the positive input delta voltage comprising:
controlling, by the logic circuit, to open an input switch of the DAC converter from a closed state to a floating state;
setting, by the logic circuit, a first capacitor of a capacitor array of the DAC converter to a first voltage, wherein the first capacitor is connected to a first terminal of the comparator; and
setting, by the logic circuit, a second capacitor of the capacitor array of the DAC circuit to a second voltage which is less than the first voltage so as to generate the positive input delta voltage which is a difference between first voltage and the second voltage, wherein the second capacitor is connected to a second terminal of the comparator.

3. The method of claim 2, wherein generating, by the DAC, the negative input delta voltage comprising:
controlling, by the logic circuit, to open an input switch of the DAC converter from a closed state to a floating state;
setting, by the logic circuit, the first capacitor of the capacitor array of the DAC converter to the second voltage, wherein the first capacitor is connected to the first terminal of the comparator; and
setting, by the logic circuit, the second capacitor of the capacitor array of the DAC circuit to the first voltage to generate the negative input delta voltage which is a difference between second voltage and the first voltage.

4. The method of claim 3, wherein receiving, by the comparator, the positive input delta voltage to generate the first digital output value comprising:
receiving, by the comparator, the positive input delta voltage to generate the first digital output value which includes the positive input delta voltage and the offset error value.

5. The method of claim 4, wherein receiving, by the comparator, the negative input delta voltage to generate the second digital output value comprising:
receiving, by the comparator, the negative input delta voltage to generate the second digital output value which includes the negative input delta voltage and the offset error value.

6. The method of claim 2, wherein the capacitor array comprises a first block which is connected to the input switch and a second block which is connected to the comparator, the first block comprises the first capacitor and the second capacitor.

7. The method of claim 6, wherein the first capacitor comprises a first terminal which is set to the first voltage and a second terminal which is connected to the input switch and the first terminal of the comparator.

8. The method of claim 6, wherein the second capacitor comprises a third terminal which is set to the second voltage and a fourth terminal which is connected to the input switch and the second terminal of the comparator.

9. The method of claim 6, wherein bias voltages of capacitors of the second block do not change while setting, by the logic circuit, the first capacitor of the capacitor array of the DAC converter to the first voltage and while setting, by the logic circuit, the second capacitor of the capacitor array of the DAC converter to the second voltage.

10. The method of claim 6, wherein capacitors of the second block closer to the input switch have larger capacitive values than capacitors of the second block closer to the comparator.

11. An analog to digital converter (ADC) comprising:
a digital to analog converter (DAC) configured to generate a positive input delta voltage and a negative input delta voltage,
a comparator electrically connected to the DAC and configured to receive the positive input delta voltage to generate a first digital output value and to receive the negative input delta voltage to generate a second digital output value,
a logic circuit configured to receive, from the comparator, the first digital output value and the second digital output value to generate a digital quantization code according to half of a sum of the first digital output value and the second digital output value, and
a calibration circuit configured to receive the digital quantization code from the logic circuit and calibrate an output of the ADC according to the digital quantization code to eliminate an offset error value.

12. The ADC of claim 11, wherein the DAC comprises an input switch and a capacitor array which includes a first capacitor and a second capacitor, wherein the DAC generates the positive input delta voltage by configuring the logic circuit to:
open the input switch of the DAC converter from a closed state to a floating state,
set the first capacitor of the capacitor array of the DAC converter to a first voltage, wherein the first capacitor is connected to a first terminal of the comparator, and
set the second capacitor of the capacitor array of the DAC circuit to a second voltage which is less than the first voltage so as to generate the positive input delta voltage which is a difference between first voltage and the second voltage, wherein the second capacitor is connected to a second terminal of the comparator.

13. The ADC of claim 12, wherein the DAC generates the negative input delta voltage by configuring the logic circuit to:
open the input switch of the DAC converter from a closed state to a floating state,
set the first capacitor of the capacitor array of the DAC converter to the second voltage, wherein the first capacitor is connected to the first terminal of the comparator, and
set the second capacitor of the capacitor array of the DAC circuit to the first voltage to generate the negative input delta voltage which is a difference between second voltage and the first voltage.

14. The ADC of claim 13, wherein the comparator configured to receive the positive input delta voltage to generate the first digital output value comprising:
the comparator configured to receive the positive input delta voltage to generate the first digital output value which includes the positive input delta voltage and the offset error value.

15. The ADC of claim 14, wherein the comparator configured to receive the negative input delta voltage to generate the second digital output value comprising:
the comparator configured to receive the negative input delta voltage to generate the second digital output value which includes the negative input delta voltage and the offset error value.

16. The ADC of claim 12, wherein the capacitor array comprises a first block which is connected to the input switch and a second block which is connected to the comparator, the first block comprises the first capacitor and the second capacitor.

17. The ADC of claim 16, wherein the first capacitor comprises a first terminal which is set to the first voltage and a second terminal which is connected to the input switch and the first terminal of the comparator.

18. The ADC of claim 16, wherein the second capacitor comprises a third terminal which is set to the second voltage and a fourth terminal which is connected to the input switch and the second terminal of the comparator.

19. The ADC of claim 16, wherein bias voltages of capacitors of the second block do not change while the logic circuit sets the first capacitor of the capacitor array of the DAC converter to the first voltage and while the logic circuit sets the second capacitor of the capacitor array of the DAC converter to the second voltage.

20. The ADC of claim 16, wherein capacitors of the second block closer to the input switch have larger capacitive values than capacitors of the second block closer to the comparator.

\* \* \* \* \*